United States Patent [19]

Bonnie et al.

[11] 4,150,440
[45] Apr. 17, 1979

[54] BUBBLE MEMORY PACKAGE

[75] Inventors: G. Patrick Bonnie, Minneapolis; John Bortins, Bloomington; Dale O. Larson, Golden Valley; Kenneth N. Bergan, Minnetonka, all of Minn.

[73] Assignee: Control Data Corporation, Minneapolis, Minn.

[21] Appl. No.: 885,712

[22] Filed: Mar. 13, 1978

[51] Int. Cl.² ............................................. G11C 19/08
[52] U.S. Cl. .................................. 365/2; 174/16 HS; 361/389; 336/61
[58] Field of Search .................... 365/2; 335/217, 300; 336/61, 65; 361/381, 386, 388, 389; 174/16 HS

[56] References Cited

U.S. PATENT DOCUMENTS

| | | | |
|---|---|---|---|
| 4,027,300 | 5/1977 | Braun | 365/2 |
| 4,101,970 | 7/1978 | Saito et al. | 365/2 |
| 4,106,106 | 8/1978 | Wolfshagen et al. | 365/2 |

*Primary Examiner*—James W. Moffitt
*Attorney, Agent, or Firm*—William J. McGinnis, Jr.

[57] ABSTRACT

A bubble memory package is comprised of a nonmagnetizable heat sink formed with a pocket for receiving the field coil and magnetic chip carrier assemblies. The heat sink is massive and capable of dissipating the heat generated by a high density memory operating at a high frequency. The heat sink is not closed over the top of the coil and memory carrier assemblies to reduce eddy and circulating electrical currents formed in an electrically conductive heat sink. The heat sink is formed with a track guide for receiving a heat sink plate which may be of electrically nonconductive material but which has sufficient heat conductivity to assist in transferring heat into the heat sink. The top of the heat sink plate is formed with a pocket for receiving a permanent magnet to generate the bias field and the bottom of the heat sink is formed with a second pocket for receiving a magnet assembly. The entire package is surrounded by a magnetic shield container.

11 Claims, 5 Drawing Figures

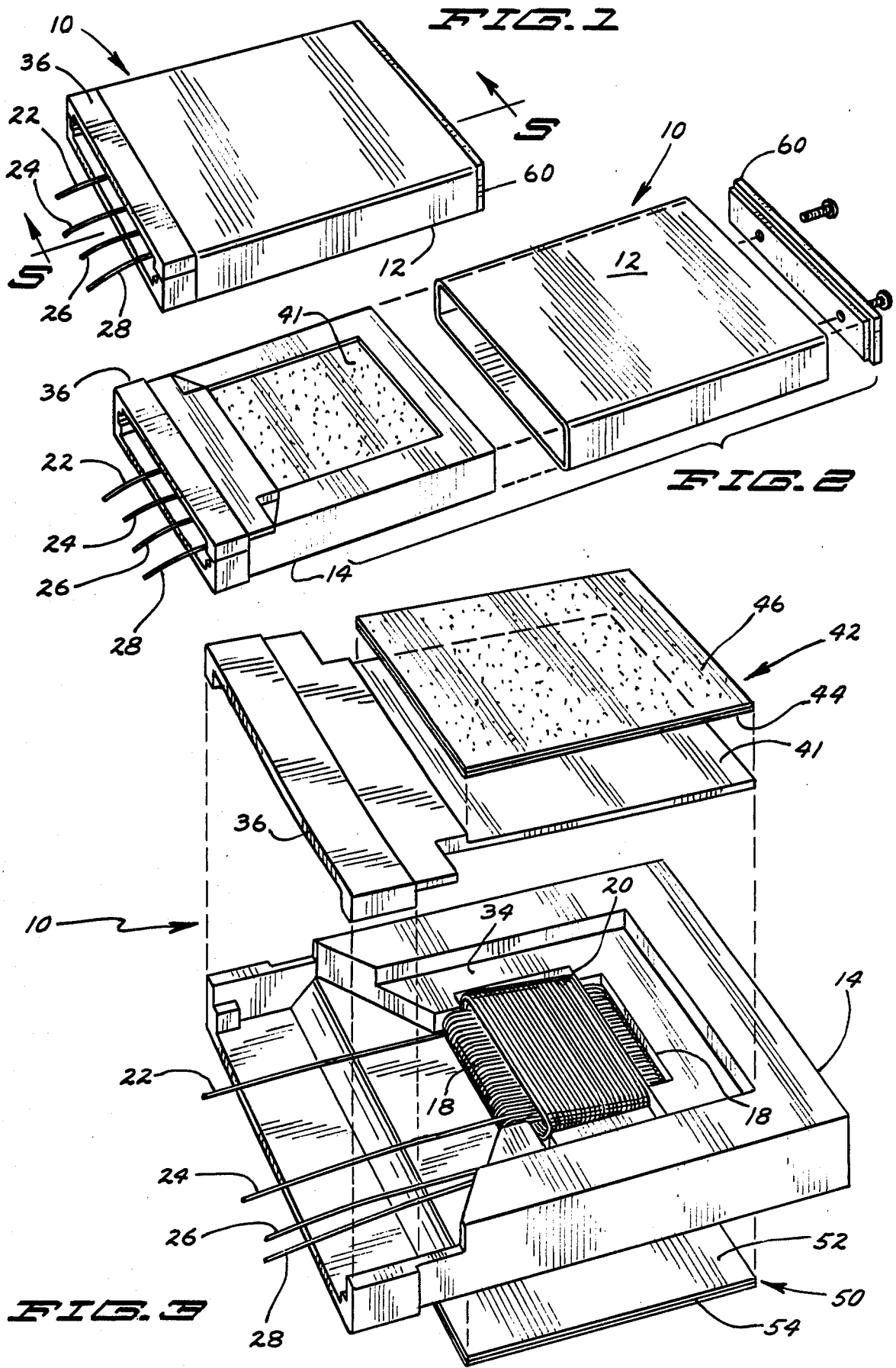

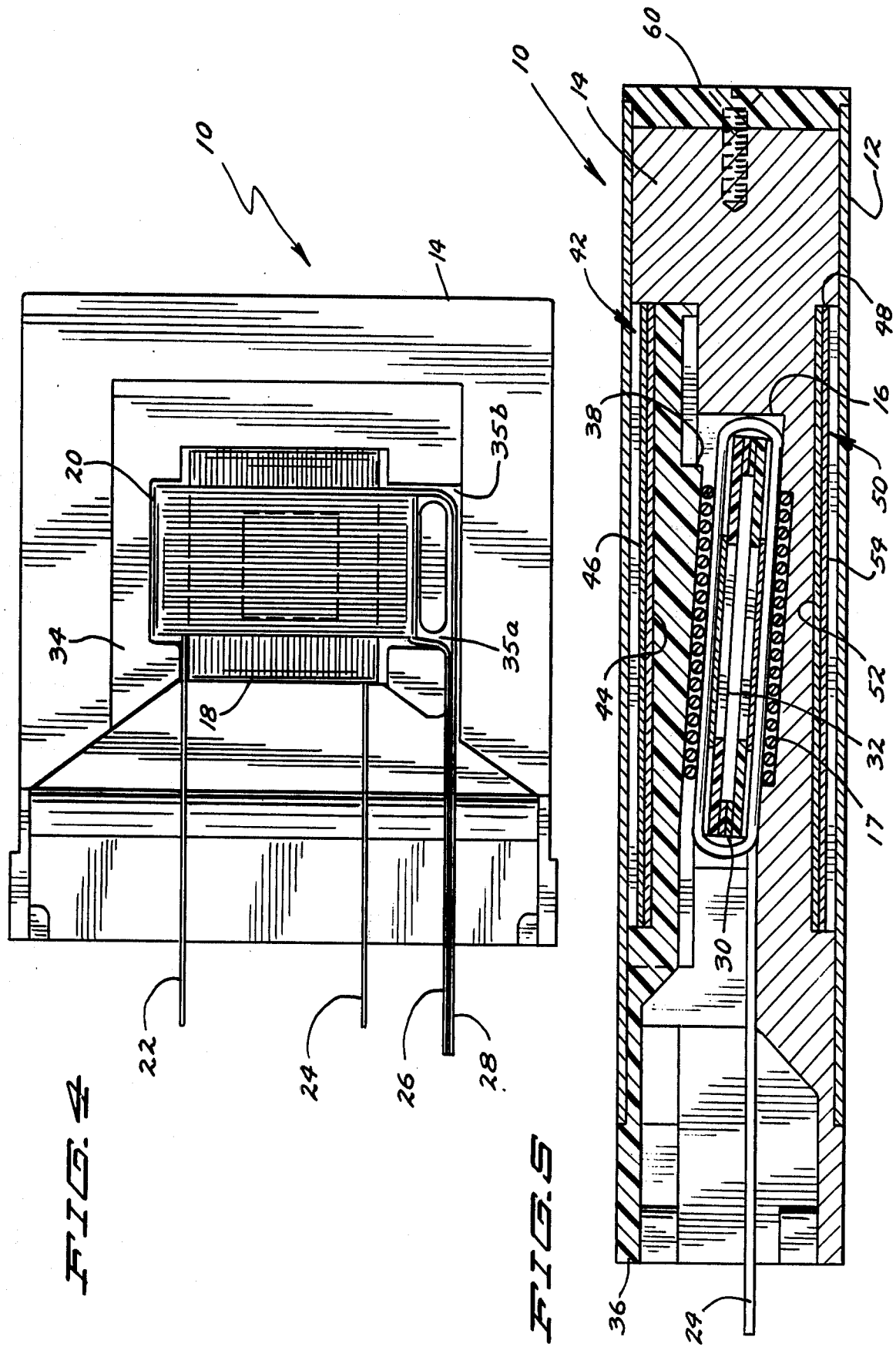

BUBBLE MEMORY PACKAGE

BACKGROUND OF THE INVENTION

This invention relates to bubble memory packaging techniques, particularly their required package for high frequency high density forms of magnetic bubble memories.

The patent literature has extensive disclosure relating to different configurations of the magnetic bubble chip materials and the arrangement of the actual memory. However, the patent literature has as yet showed less development in the very important packaging and assemblying techniques for such memories. Up to the present time, bubble memories have operated at comparatively low memory densities and at comparatively low frequency rates. However, as bubble memories become more highly developed, packaging techniques suitable for use outside of a laboratory environment with higher density and higher frequency devices become necessary. These packaging devices must perform several comparatively complex functions. A package for a bubble memory must contain magnetic and electrical fields generated by the device within the package while at the same time protecting the memory device from external magnetic and electrical fields. The bubble memory device will generate a certain amount of heat which must be dissipated into the environment while at the same time maintaining the memory device at a uniform temperature. And finally, the packaging device must provide uniform magnetic fields within the space where the memory device operates as well as uniform heat dissipation. As greater frequencies and as greater memory densities are being developed for memory devices, these requirements of the packaging assembly become more severe.

U.S. Pat. No. 3,848,209 discloses an assembly for mounting the field coils for a magnetic bubble device. This patent is not particularly relevant to the present disclosure but is interesting as a step in the development of bubble memory devices. U.S. Pat. No. 3,996,574 shows a package assembly for a magnetic bubble device. This represents to a substantial degree the present state of the art for containing bubble memory devices. However, what is shown is a device having multi-turn field coils which would be most suitable for comparatively low frequency applications. The coil forms are thoroughly conductive in the structure shown. But there is no substantial heat sink component for removing the greater amounts of heat expected at high frequency operation. Also, the memory density of the device is comparatively low and associated with lower power dissipation systems. The magnet structure, the heat sink system and several other aspects of the present disclosure are substantially different from that shown in the patent. Similarly, the structure shown in U.S. Pat. No. 4,012,723 shows a magnetic bubble memory package but one which is substantially different from that of the present disclosure.

SUMMARY OF THE INVENTION

The present invention consists of a bubble memory package comprising a massive heat sink which may be of an electrically conductive nonmagnetizable heat conductive material such as aluminum or copper. This heat sink is formed with a pocket in the internal portion thereof for receiving the field coil assembly which contains a chip carrier assembly for the magnetic memory device. This heat sink provides for uniform conduction of heat away from the field coil assembly and prevents thermal gradients from developing in the magnetic memory device. The heat sink when it is formed of an electrically conductive material provides an effective shield for the high frequency alternating current which is applied to the field coils while allowing the uniform magnetic bias field from the bias magnets to penetrate. A track guide is formed in the heat sink to provide a highly heat conductive path from a heat sink plate which is placed on top of the field coil assembly and into the heat sink. The heat sink plate may be of an electrically conductive or electrically nonconductive material but a material which is highly heat conductive. If the heat sink plate is a conductor it should be insulated from the heat sink. Heat sink plates have been used of both beryllium oxide and of various plastic or ceramic materials. A pocket is formed in the top side of the heat sink plate and of the heat sink for receiving a flat permanent magnet assembly which consists of a smoothing plate and a magnet. This entire package is assembled and fitted into a magnetic field shield can which may be of a material such as permalloy. The assembly is constructed in such a fashion that it may be disassembled for replacement of the field coil or memory elements without sacrificing the package itself.

In the figures:

FIG. 1 is a perspective view of an assembled magnetic bubble memory package according to the present invention, FIG. 2 is an exploded view of the structure shown in FIG. 1, FIG. 3 is another exploded view of the structure shown in FIGS. 1 and 2, FIG. 4 is a top plan view of a portion of the structure shown in FIG. 2, and FIG. 5 is a cross-sectional view along lines 5—5 of FIG. 1.

DESCRIPTION OF THE PREFERRED EMBODIMENTS

As shown in the figures, a bubble memory package 10 has an outer magnetic field shielding can 12 which is the outermost portion of the structure. This can may be made of a permeable material like metal such as permalloy. This can serves a function of providing a magnetic flux path for the permanent magnets, yet to be described, which provide the bias field for the memory device and is a shield to prevent external fields of whatever frequency from disturbing operation of the device. Even though the can has open ends, the external magnetic fields are attenuated by approximately a factor of 100. For illustrative purposes, the metal forming the can may be approximately one millimeter thick.

As shown in exploded views in FIGS. 2 and 3 and in top plan view form in FIG. 4, a heat sink 14 comprises the major structural element contained by the magnetic shield can 12. Heat sink 14 is of a magnetically transparent character to nonvarying magnetic fields and is of a material which is substantially nonmagnetizable. Suitable materials would be copper or aluminum or silver. Devices embodying the present invention have been built using aluminum heat sinks which have proved to be satisfactory. The heat sink 14 is formed with an internal pocket 16 having a floor 17 at a slight angle with respect to the horizonal as seen in the figures. This angle may be approximately three or four degrees so that the magnetic device structure, yet to be described, when placed within the heat sink will experience a slight planar magnetic field component necessary for the reliable starting and stopping of bubble propagation. Thus, the heat sink itself is formed in such a way that the bubble memory device and field coil structure are held rigidly at the proper angle without additional structure or adjustment necessary for this purpose. An inner field coil 18 and an outer field coil 20 placed at right angles to one another are adapted to fit partially within pocket 16. As shown in this illustrative embodiment, but not critical to the invention claimed herein, the field coils are comprised of multiple turns of wire in a single layer coil having comparatively square or uniform 90 degree corners. The field coil 18 has leads 22 and 24 which are trained from pocket 16 to an outer opening through a path formed in the heat sink material. Similarly, field coil 20, has leads 26 and 28 trained through paths left in the heat sink material to the exterior of the device.

As partially seen in the figures, a chip carrier assembly 30 is retained inside the inner field coil 18. The chip carrier has, for illustrative purposes, multiple chips 32 thereon. One contemplated structure for use with the present invention would have a dual chip carrier having four bubble memory chips on each carrier for a total of eight bubble memory chips in the device. It is contemplated that such a device would be operated in the frequency range of 400 to 500 khz.

Heat sink 14 is formed with a track guide 34 for receiving a magnetically transparent heat sink plate 36.

Track 34 is formed with channels 35a and 35b for wires leading to and from the coil assembly. For example, wire 26 goes to coil 20 in channel 35a and wire 28 goes to coil 20 in channel 35b.

Track guide 34 is formed with a substantial area or ledge for providing an excellent heat conductive path for heat sink plate 36. Heat sink plate 36 may be of a material such as beryllium oxide. The plate may also be of a ceramic or plastic material which is highly heat conductive. The beryllium oxide is preferred for the most stressful applications of the present invention because of its high heat conducting properties combined with its property of not being electrically conducting. This allows heat dissipation from the chip carrier and field coil assembly while at the same time preventing an electrical path being formed for generating eddy or circulating currents which would cause increased power consumption and heat dissipation. Thus, the open portion of the heat sink 14 provides an interruption in an electrical path which would otherwise be formed and which would allow circulating electrical currents which would increase power consumption and heat dissipation. Further, a heat sink plate of beryllium oxide by being highly heat conductive would minimize any temperature or thermal gradients across the memory device of the sort which would interfere with proper operation. It has been found that bubble memory devices are highly critical to temperature variations in the device. Also, it is desirable to have the bubble memory device at a comparatively stable operating temperature and this ability is enhanced by the present invention employing the heat sink and heat sink plate combination of materials. It should be noted that in practice satisfactory devices have been manufactured using a plastic or ceramic heat sink plate which has the properties of being sufficiently heat conductive for the necessary application as well as providing an interruption in circulating currents which may occur in the heat sink by operation of the alternating current application to the field coils for the device.

Heat sink plate 36 is formed with a hold down projection 38 to hold the field coil assembly in place at the desired angle to provide the magnetic field gradient for the memory device. This angle is of course the same angle at which the floor 17 of pocket 16 in the heat sink is formed.

The upper surface of heat sink plate 36 has a pocket 41 for holding a magnet assembly 42. Magnet assembly 42 is the permanent magnet bias field assembly necessary for operation of a bubble memory device. This magnet assembly 42 is formed with a smoothing plate 44 of a magnetically permeable material which tends to increase the uniformity of the magnetic field but which is itself not a magnet. A suitable material for smoothing plate 44 would be a ferrite material such as manganese-zinc ferrite. The magnet 46 is formed of a suitable magnetic material for generating a magnetic field normal to the surface of the plate. A ferrite material such as barium ferrite would be suitable for this magnet.

And finally, heat sink 14 is formed with a pocket 48 on the bottom surface thereof for receiving a magnet assembly 50 similar to magnet assembly 42. Thus, magnet assembly 50 is comprised of a smoothing plate 52 and magnet 54. In both cases, the magnet assembly would generally consist of a magnet and smoothing plate bonded or glued together. Magnets 42 and 54 are oriented to be mutually attracting.

An end plate 60 is mounted to the heat sink 14 and, in the assembled package, mates with shield can 12 to form an appropriate seal. The opposite or open end is adapted to mate with an electrical connector.

One feature of using the barium ferrite magnets is that the field generated by such magnets responds to temperature variations in approximately the same way as bubble memory chips, so that the memory device is comparatively temperature insensitve.

The smoothing plate is made of what is called on occasion a soft ferrite. Any low coercivity, high permeability material can be used for a smoothing plate. Permalloy would be superior for this function because of its less cost and better thermal conductivity. However, in order to minimize hysteresis and eddy current losses at high frequencies it has been found necessary for best operation of the memory device to use the electrically nonconducting soft ferrites such as manganese-zinc ferrite. Thus, because of the comparatively lower heat conductivity and heat capabilities of the magnetic elements for best operation of the memory device, greater reliance is placed on the heat conductivity and thermal properties of the heat sink.

What is claimed is:

1. In a bubble memory device, the improvement comprising a bubble memory package comprised of:
    a heat sink formed with a pocket for receiving a field coil assembly on an inner surface thereof and having at an elevated relationship with respect to said pocket a track guide formed therein and further having a pocket on the outer surface thereof for receiving a magnet assembly and
    a heat sink plate adapted to removably fit in said track guide of said heat sink and having on its inner surface a hold down projection 38 to hold a field coil assembly in place and having on the outer surface thereof a pocket for receiving a magnet assembly.

2. The structure of claim 1 wherein said heat sink is comprised of a magnetically transparent material for a nonvarying magnetic field which is substantially nonmagnetizable.

3. The structure of claim 2 wherein the material for said heat sink is selected from the group of materials comprising copper and aluminum.

4. The structure of claim 1 wherein said heat sink plate is formed of a magnetically transparent material to a nonvarying magnetic field and is substantially nonmagnetizable.

5. The structure of claim 4 wherein said heat sink plate is formed from a material selected from the group of materials comprising beryllium oxide, ceramic and plastics.

6. A bubble memory package comprising
a magnetic field shielding can,
a heat sink formed of electrically conductive, magnetically transparent, substantially nonmagnetizable material and formed with an internal field coil receiving pocket and a track guide formed in elevated relationship thereto,
a heat sink plate formed of electrically nonconductive material, magnetically transparent and substantially nonmagnetizable, of a heat conductive material adapted to fit on said track guide formed in said heat sink.

7. The structure of claim 6 wherein said heat sink is formed with a pocket on the bottom surface thereof for receiving a magnet assembly and wherein said heat sink plate has formed on the top surface thereof with a pocket for receiving a magnet assembly.

8. The structure of claim 7 wherein said magnet assemblies are comprised of a barium ferrite magnet bonded to a manganese-zinc ferrite smoothing plate.

9. The structure of claim 6 wherein said heat sink pocket is formed with a floor inclined at a preselected angle and wherein said heat sink plate is formed with a hold down projection at the same predetermined angle as the floor of the pocket of said heat sink.

10. The structure of claim 6 wherein said heat sink is formed of a material from the group of materials comprising copper and aluminum.

11. The structure of claim 6 wherein said heat sink plate is formed of beryllium oxide.

* * * * *